United States Patent
Peng et al.

(10) Patent No.: US 7,369,412 B2
(45) Date of Patent: May 6, 2008

(54) HEAT DISSIPATION DEVICE

(75) Inventors: Xue-Wen Peng, Shenzhen (CN);
Rui-Hua Chen, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 50 days.

(21) Appl. No.: 11/308,775

(22) Filed: May 2, 2006

(65) Prior Publication Data
US 2007/0258218 A1 Nov. 8, 2007

(51) Int. Cl.
*H05K 7/20* (2006.01)

(52) U.S. Cl. ............ 361/715; 361/698; 361/699; 361/700; 361/719; 165/80.4; 165/104.21; 165/104.33

(58) Field of Classification Search ............. 361/686, 361/687, 690–699, 700–712, 714–727, 729, 361/802, 803, 816; 257/706–727; 174/15.1, 174/16.3, 252; 165/80.2, 80.3, 80.4, 80.5, 165/104.32, 104.34, 104.33, 121, 122, 106, 165/185, 104, 26; 454/184
See application file for complete search history.

(56) References Cited

U.S. PATENT DOCUMENTS

| | | | |
|---|---|---|---|
| 5,331,510 A * | 7/1994 | Ouchi et al. | 361/702 |
| 5,409,055 A * | 4/1995 | Tanaka et al. | 165/104.33 |
| 5,946,191 A * | 8/1999 | Oyamada | 361/700 |
| 5,986,882 A * | 11/1999 | Ekrot et al. | 361/687 |
| 6,055,157 A * | 4/2000 | Bartilson | 361/699 |
| 6,538,884 B1 * | 3/2003 | Wong et al. | 361/688 |
| 6,671,177 B1 * | 12/2003 | Han | 361/719 |
| 6,717,811 B2 * | 4/2004 | Lo et al. | 361/698 |
| 6,937,474 B2 * | 8/2005 | Lee | 361/715 |
| 7,019,974 B2 * | 3/2006 | Lee et al. | 361/700 |
| 7,177,154 B2 * | 2/2007 | Lee | 361/704 |
| 2005/0122686 A1 * | 6/2005 | Oyamada | 361/699 |
| 2006/0164808 A1 * | 7/2006 | Stefanoski | 361/700 |

FOREIGN PATENT DOCUMENTS

| | | |
|---|---|---|
| CN | 2718653 Y | 8/2005 |
| JP | 20044297024 A * | 10/2004 |
| TW | M267834 | 6/2005 |
| TW | 200534081 | 10/2005 |

OTHER PUBLICATIONS

The article: "Cooling System for Chip Carrier on Card", IBM Technical Disclosure Bulletin, Sep. 1988, vol. 31, Issue 4, pp. 39-40.*

* cited by examiner

*Primary Examiner*—Michael Datskovskiy
(74) *Attorney, Agent, or Firm*—Jeffrey T. Knapp

(57) ABSTRACT

A heat dissipation device used for dissipating heat from heat generating electronic components mounted on an interface card, which has a mounting bracket for being mounted to a computer case, includes a heat-absorbing member, a pair of heat pipes and a pair of heat-dissipating members. The heat-absorbing member is bound to the heat generating electronic components for absorbing heat generated by the electronic components. The heat-dissipating members are disposed within the computer case and located at one peripheral side edge of the graphics card. The heat-absorbing member and the heat-dissipating members are connected by the heat pipes so as to transfer the heat received by the heat-absorbing member to the heat-dissipating members for further dissipating.

19 Claims, 6 Drawing Sheets

HEAT DISSIPATION DEVICE

FIELD OF THE INVENTION

The present invention relates to a heat dissipation device, and more particularly to a heat dissipation device for dissipating heat generated by an interface card such as a graphics card.

DESCRIPTION OF RELATED ART

With the rapid development of computer technology, graphics card, as one of the basic important elements of computer system, its processing speed and function upgrade greatly. It generates a great deal of heat in operation. Generally, a heat dissipation device is used to dissipate the heat generated by a graphics card.

Generally, a graphics card connects with a computer system by inserting it into a socket positioned on a mainboard. Conventionally, a heat dissipation device for a graphics card is positioned on the front face or the rear face of the graphics card. However, the electronic components and other components are generally disposed densely within the computer system. So space adjacent to the front face and the rear face of the graphics card is limited. As a result, the heat dissipating area of the heat dissipation device is limited when the heat dissipation device is mounted on the front face or the rear face of a graphics card.

Therefore, it is necessary to provide a heat dissipation device for a graphics card which can increase greatly the heat dissipation capability and dissipate the heat generated by the graphics card efficiently.

SUMMARY OF THE INVENTION

The heat dissipation device configured for dissipating heat from heat generating electronic components mounted on an interface card, which has a mounting bracket enabling it to be mounted to a computer case, includes a heat-absorbing member, a pair of heat pipes and a pair of heat-dissipating members. The heat-absorbing member can be attached to the heat generating electronic components so as to absorb heat generated thereby. The heat-dissipating members are disposed within the computer case and located at one peripheral side edge of the graphics card. The heat-absorbing member and the heat-dissipating members are connected by the heat pipes so as to transfer the heat received by the heat-absorbing member to the heat-dissipating members for further dissipating.

BRIEF DESCRIPTION OF THE DRAWINGS

Other advantages and novel features will become more apparent from the following detailed description of preferred embodiments when taken in conjunction with the accompanying drawings. The components in the drawings are not necessarily drawn to scale, the emphasis instead being placed upon clearly illustrating the principles of the present apparatus and method. Moreover, in the drawings, like reference numerals designate corresponding parts throughout the several views, in which.

DETAILED DESCRIPTION OF THE INVENTION

FIGS. 1 to 6 show a heat dissipation device 100 used for dissipating heat from heat generating electronic components mounted on an interface card 10 which is installed within a computer case 70. In this embodiment, the interface card is a graphics card 10.

Figure 1:
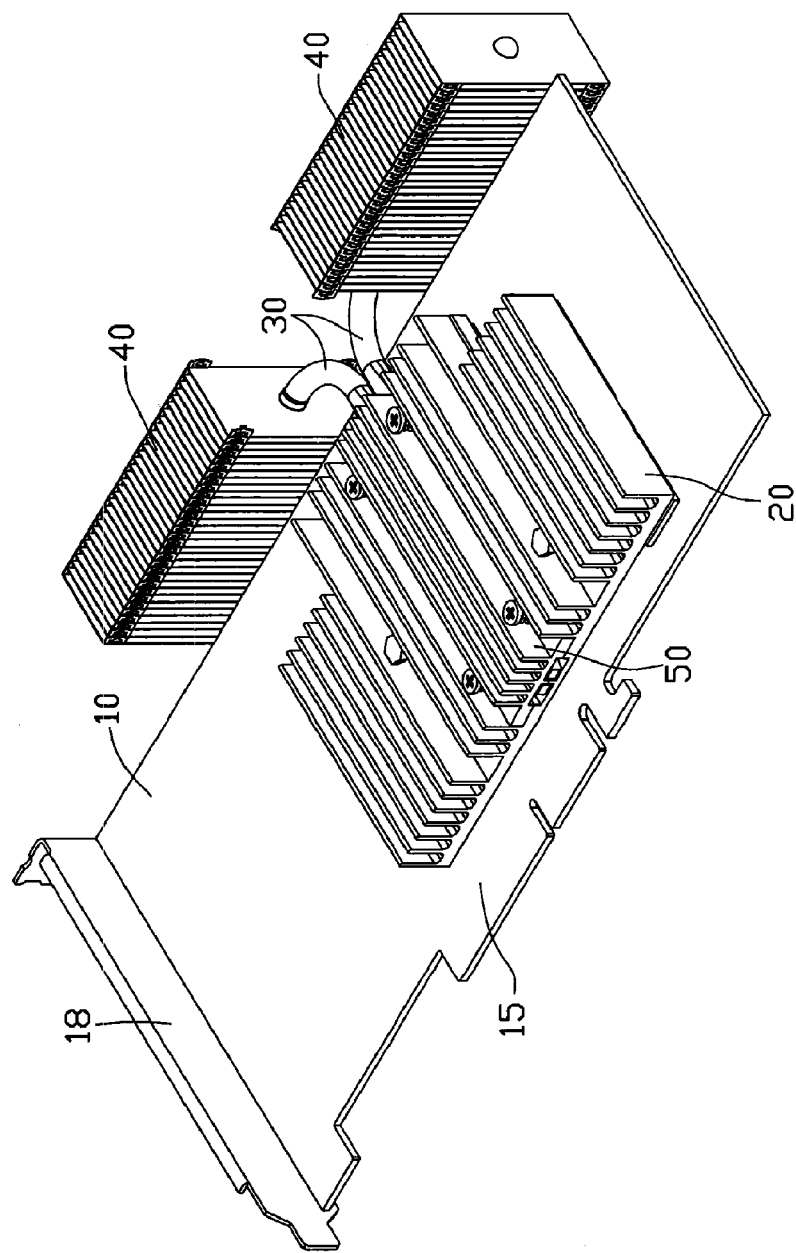
FIG. 1 is a perspective view of a heat dissipation device of an interface card according to a preferred embodiment of the present invention.

Referring to FIG. 1, the heat dissipation device 100 includes a heat-absorbing member 20, a pair of heat pipes 30, a pair of heat-dissipating members 40 and a fin plate 50. The heat-absorbing member 20 is thermally connected with the electronic components so as to receive heat generated by the electronic components. The heat-absorbing member 20 and the heat-dissipating members 40 are thermally connected by the heat pipes 30 so as to transfer the heat received by the heat-absorbing member 20 to the heat-dissipating members 40 for dissipating.

Figure 2:
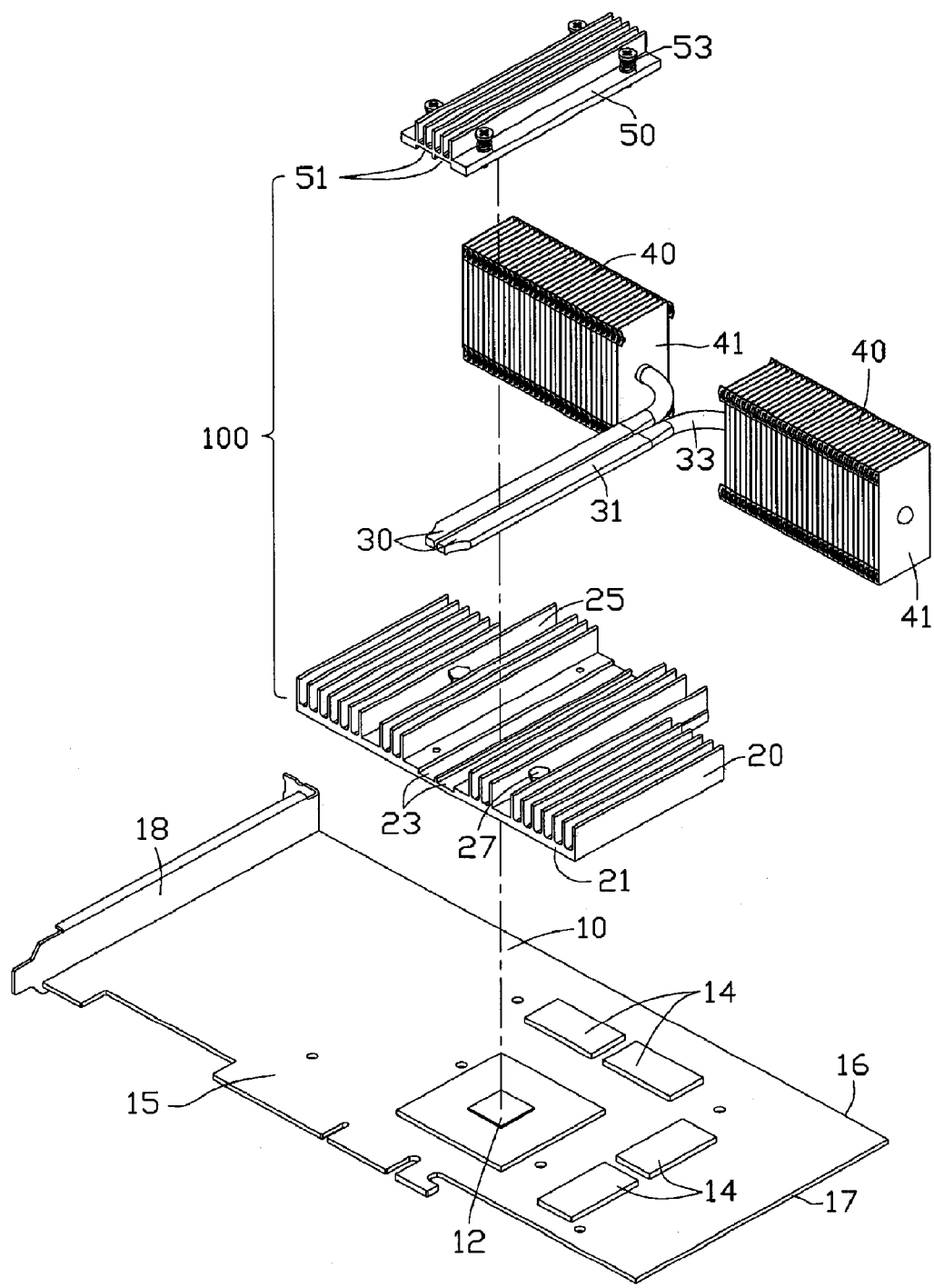
FIG. 2 is an exploded perspective view illustrating the structure of the heat dissipation device and the interface card of FIG. 1.

FIG. 2 is an exploded perspective view of the heat dissipation device 100 and the graphics card 10 of FIG. 1. The graphics card 10 has a plug 15 formed at a bottom side edge thereof. A mounting bracket 18 is formed on a lateral side edge of the graphics card 10 perpendicular to the bottom side edge at which the plug 15 is formed and opposite to the other lateral side edge 17. The heat generating electronic components of the graphics card 10 include a GPU (graphics processing unit) 12 and a plurality of memory chips 14. The memory chips 14 are positioned around the GPU 12.

The heat-absorbing member 20 has a heat-absorbing plate 21; the heat-absorbing plate 21 has a pair of grooves 23 formed in an outer surface thereof for receiving the corresponding heat pipes 30. A plurality of heat-dissipating fins 25 is preferably formed on the outer surface of the heat-absorbing plate 21 so as to dissipate a portion of heat conducted from the electronic components. The heat-dissipating fins 25 and the heat-dissipating plate 21 are integrally made by aluminum or copper extrusion. Alternatively, the heat-dissipating fins 25 and the heat-dissipating plate 21 may be separately formed and then assembled together. The heat-dissipating fins 25 generally have a relative low height so as not to interfere with other components within the computer case 70 such as network cards.

The rear surface of the heat-absorbing plate 21 is made large enough to contact with the entire top surface of the GPU 12 and the memory chips 14. Conventionally, the heat generated from the GPU 12 and the memory chips 14 is dissipated by different heat dissipation devices. In this embodiment, the heat-absorbing plate 21 absorbs the heat generated by the GPU 12 and the memory chips 14 simultaneously. The heat-absorbing plate 21 is bound to the GPU 12 and the chips 14 by a plurality of fixing components 27 such as bolts.

The pair of heat pipes 30 are positioned symmetrically about an assumed middle line of the heat-absorbing member 20. Each of the heat pipes 30 is bent approximately to assume an "L" shape but not restricted to this shape. Each of the heat pipes 30 has an evaporator section 31 and a condenser section 33; the evaporator section 31 and condenser section 33 are bent at an angle of about 90 degrees. The evaporator sections 31 of the two heat pipes 30 are positioned in the corresponding grooves 23 of the heat-absorbing member 20. The evaporator section 31 has a noncircular cross-section in order to prevent the heat pipes 30 from rotating in relation to the heat-absorbing plate 21.

Figure 3:
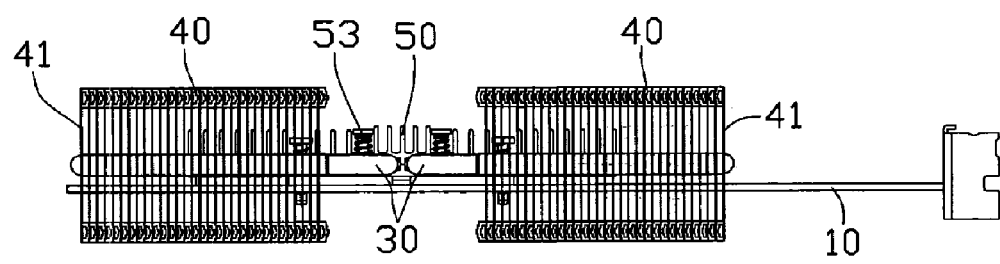
FIG. 3 is a top view of the heat dissipation device and the interface card of FIG. 1.
Figure 4:
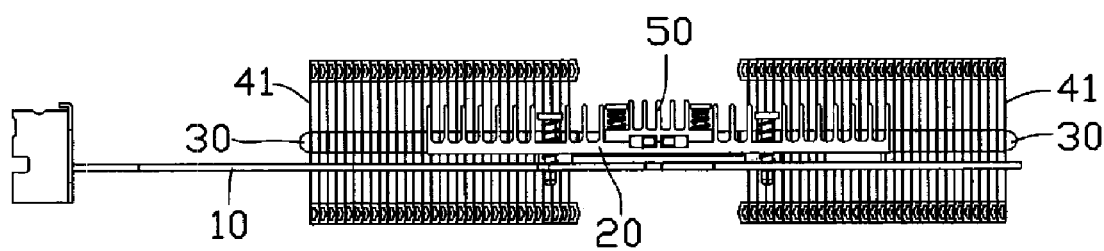
FIG. 4 is a bottom view of the heat dissipation device and the interface card of FIG. 1.
Figure 5:
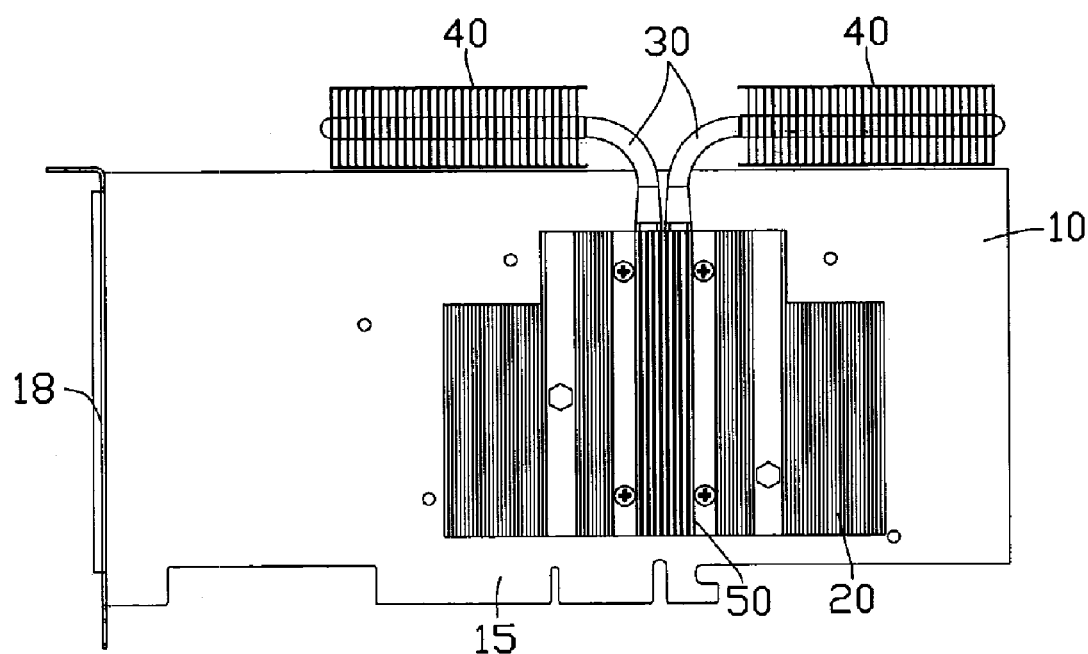
FIG. 5 is a front view of the heat dissipation device of an interface card in FIG. 1.

Referring to FIGS. 3-5, the two heat-dissipating members 40 are mounted to a top side edge 16 of the graphics card 10 opposing the plug 15. Each of the heat-dissipating members 40 has a plurality of heat-dissipating fins 41 stacked along the condenser section 33 of the corresponding heat pipe 30. The heat-dissipating fins 41 and the condenser section 33 of the heat pipe 30 may be combined together by soldering or other means.

A fin plate 50, having a plurality of heat-dissipating fins (not labeled) formed on an outer surface thereof, is attached to the heat-absorbing plate 21 of the heat-absorbing member 20 by a plurality of fixing components 53 such as blots. The fin plate 50 has two grooves 51 formed in a rear surface thereof. When the fin plate 50 and the heat-absorbing plate 21 are bound together, the grooves 23 and the grooves 51 cooperatively form two holes for receiving the evaporator sections 31 of the heat pipes 30 therein.

In operation of the GPU 12 and the chips 14, heat generated by the GPU 12 and the chips 14 of the graphics card 10 is absorbed by the heat-absorbing plate 21; then, the heat is partially dissipated by the heat-dissipating fins 25 and the fin plate 50. The other portion of heat is transferred to the heat-dissipating members 40 for dissipating via the heat pipes 30. In this way full use is made of the peripheral space of the graphics card 10 for dissipating heat, the whole effective heat dissipating area is increased, and the heat dissipation effect is enhanced.

Figure 6:
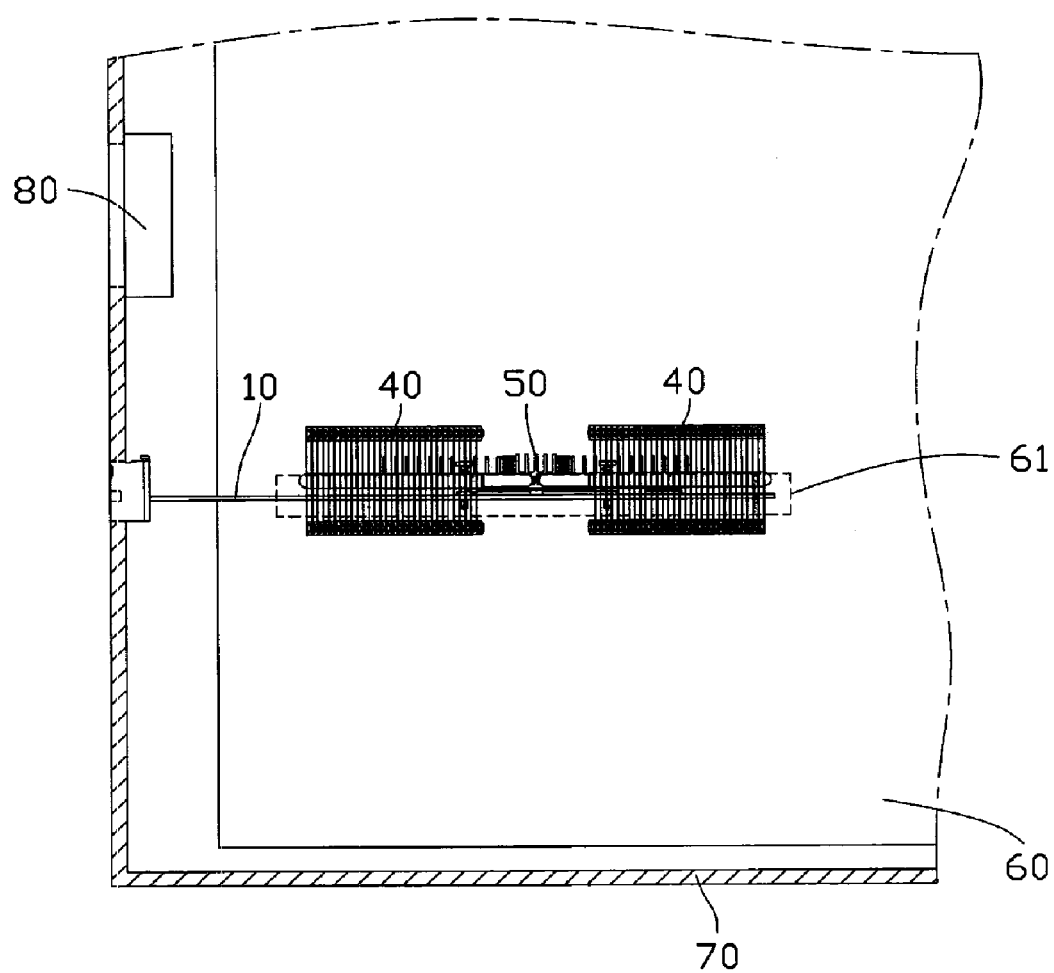
FIG. 6 is an abridged general top view of the heat dissipation device of an interface card applied in a computer case.

FIG. 6 is an abridged general view of the heat dissipation device 100 applied in the computer case 70. The graphics card 10 is inserted into a pre-established slot 61 of a mainboard 60 installed within the computer case 70. The heat-dissipating members 40 are disposed within the computer case 70 at a top of the graphics card 10. The heat, transferred to the heat-dissipating members 40 of the heat dissipation device 100 is transferred to the outside of the case 70 quickly by a fan 80 positioned on the case 70.

The computer case 70 has a space adjacent to the top side edge 16 of the graphics card 10. Therefore, the heat-dissipating fins 41 may be formed to have enough surface area for dissipating heat based on the amount of heat requiring dissipation.

Additional advantages and modifications will be readily understood by those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

What is claimed is:

1. A heat dissipation device for dissipating heat from electronic components mounted on a front face of an interface card, the interface card having a bottom edge for electrical connecting to a mainboard and a top edge opposite the bottom edge, the heat dissipation device comprising:
   a heat-absorbing member adapted for being mounted to the electronic components for absorbing heat generated by the electronic components;
   a heat-dissipating member adapted for being positioned at the top edge of the interface card; and
   a heat pipe having an L-shaped configuration, the heat pipe thermally connecting the heat-absorbing member with the heat-dissipating member so as to transfer heat from the heat-absorbing member to the heat-dissipating member.

2. The heat dissipation device as claimed in claim 1, wherein the bottom edge of the interface card forms a plug for inserting into a slot on the mainboard.

3. The heat dissipation device as claimed in claim 1, wherein the heat-absorbing member includes a heat-absorbing plate and the heat pipe comprises an evaporator section mounted to the heat-absorbing plate.

4. The heat dissipation device as claimed in claim 3, wherein the heat-absorbing plate is made of one of aluminum and copper.

5. The heat dissipation device as claimed in claim 3, wherein at least one groove is defined in the heat-absorbing plate to receive the heat pipe therein.

6. The heat dissipation device as claimed in claim 3, wherein the heat-absorbing plate has a plurality of heat-dissipating fins integrally formed on an outer surface thereof.

7. The heat dissipation device as claimed in claim 3, wherein a fin plate is bound to the heat-absorbing plate of the heat-absorbing member to sandwich the evaporator section of the heat pipe therebetween.

8. The heat dissipation device as claimed in claim 7, wherein at least one groove is defined in the fin plate to receive the heat pipe therein.

9. The heat dissipation device as claimed in claim 7, wherein the fin plate has a plurality of heat-dissipating fins integrally formed on an outer surface thereof.

10. The heat dissipation device as claimed in claim 3, wherein the evaporator section of the heat pipe has a noncircular cross section.

11. The heat dissipation device as claimed in claim 3, wherein the heat-dissipating member comprises a plurality of heat-dissipating fins, the heat pipe comprises a condenser section extending through the heat-dissipating fins.

12. A combination comprising:
    an interface card installed within a computer case, a heat generating electronic component mounted on the interface card;
    a heat-absorbing member comprising heat-absorbing plate and a fin plate, the heat-absorbing plate and the fin plate each comprising a plurality of heat-dissipating fins formed on an outer surface thereof and the heat-absorbing plate being directly mounted to the heat generating component for absorbing heat therefrom, the fin plate being bound to the heat-absorbing plate of the heat-absorbing member;
    a heat-dissipating member mounted to a top side edge of the interface card and located within the computer case; and
    a heat pipe comprising an evaporator section sandwiched between the heat-absorbing plate and the fin plate of the heat-absorbing member, and the heat pipe thermally connecting the heat-absorbing member with the heat-dissipating member so as to transfer heat from the heat-absorbing member to the heat-dissipating member.

13. The combination as claimed in claim 12, further comprising an additional heat pipe and an additional heat-dissipating member, wherein each of the heat pipes comprises a condenser section connecting with a corresponding heat-dissipating member.

14. The combination as claimed in claim 13, wherein each of the heat-dissipating members comprises a plurality of fins stacked along the condenser section of a corresponding heat pipe.

15. The combination as claimed in claim 13, wherein the heat-dissipating members are positioned on the top side edge of the card separately and symmetric to each other about an assumed middle line of the heat-absorbing member.

16. The combination as claimed in claim 12, wherein the interface card is a graphics card, the electronic component being a graphic processing unit of the graphics card.

17. A graphics card comprising:
  a printed circuit board having a bottom edge forming a plug for electrically connecting with a mainboard and a top edge opposite the bottom edge;
  a graphic processing unit mounted on a face of the printed circuit board;
  a heat-absorbing member mounted on the face of the printed circuit board and thermally connecting with the graphic processing unit;
  a pair of heat-dissipating members mounted on the top edge of the printed circuit board; and
  a pair of heat pipes each having an L-shaped configuration, thermally connecting the heat-absorbing member and the pair of heat-dissipating members.

18. The graphics card as claimed in claim 17, wherein the heat pipes are substantially symmetrical to each other about a middle line of the heat-absorbing member.

19. The combination as claimed in claim 12, wherein the heat pipe has an L-shaped configuration.

* * * * *